US007230215B2

(12) United States Patent
Lin

(10) Patent No.: US 7,230,215 B2
(45) Date of Patent: Jun. 12, 2007

(54) HEAT GENERATING DEVICE FORMED OF HEAT GENERATING DIAPHRAGM PLATES

(76) Inventor: Cheng Ping Lin, 5 th Fl. No. 26, Sec. 3, Ren-ai Rd., Taipei (TW)

( * ) Notice: Subject to any disclaimer, the term of this patent is extended or adjusted under 35 U.S.C. 154(b) by 99 days.

(21) Appl. No.: 11/211,626

(22) Filed: Aug. 26, 2005

(65) Prior Publication Data

US 2007/0045290 A1 Mar. 1, 2007

(51) Int. Cl.
*H05B 3/02* (2006.01)
*H01L 10/14* (2006.01)

(52) U.S. Cl. ...................................... 219/546; 338/318

(58) Field of Classification Search ................ 219/546, 219/538, 548, 550; 338/321, 315, 318; *H05B 3/02; H01L 10/14*

See application file for complete search history.

(56) References Cited

U.S. PATENT DOCUMENTS 2,858,402 A * 10/1958 Griffes ........................ 338/58
4,419,564 A * 12/1983 Marcoux .................... 219/206
4,654,627 A * 3/1987 Harkness .................... 338/319
4,847,585 A * 7/1989 Kirilloff et al. ............... 338/58
4,855,570 A * 8/1989 Wang ......................... 219/532
5,068,637 A * 11/1991 Bayer .......................... 338/57
5,198,640 A * 3/1993 Yang .......................... 219/530
5,221,917 A * 6/1993 Cummins ................... 338/281

* cited by examiner

*Primary Examiner*—Daniel Robinson
(74) *Attorney, Agent, or Firm*—Troxell Law Office, PLLC

(57) ABSTRACT

Disclosed herein is a heat generating device formed of heat generating diaphragm plates comprises an electrically conducting supporting frame and a plurality of heat generating diaphragm plates. The supporting frame consists of two coupled supporting plates facing against each other with a predetermined spacing, surfaces on the two supporting plates opposite to each other are respectively provided with several insertion slots whose wall surfaces are coated to form electrode terminals such that when the heat generating diaphragm plates are inserted into the insertion slots, an electrical connection is formed among silver solders provided at both terminals of each heat generating diaphragm plate and the electrodes formed on the insertion slots thereby completing a heat generating device capable of adjusting heat generation capacity.

2 Claims, 5 Drawing Sheets

HEAT GENERATING DEVICE FORMED OF HEAT GENERATING DIAPHRAGM PLATES

BACKGROUND OF THE INVENTION

1. Field of the Invention

The present invention relates to a heat generating device formed of a plurality of heat generating diaphragm plates which being sustained by an electrically conducting supporting frame at two ends such that the heat generating capacity of the heat generating device is determined by the number of the heat generating diaphragm plates sustained by the supporting frame.

2. Description of the Prior Art

In present-day, the heat generating device is widely applicable in many respects such as heat reservation equipment, heating appliances, or other heating apparatuses. Of all kinds of heat generating devices, the electrical heater is the most popular one which essentially utilizes a heater coil or a quartz tube installed under the material to be heated. However, both types of heat generating devices require to occupy an excessively large spacing as far as the heat generating efficiency is concerned. Recently, there has appeared a new heating appliance being formed of an electric heater diaphragm plate with two electrodes, is installed on a substrate. However, like the former electrical heater, the latter type exhibits a rather poor heat generating efficiency and fails to serve the user the function of adjustable heat generating capacity according to the actual requirement therefore it is not welcome to users.

For these defects noticeable on the prior art, an improvement is seriously required. The inventor has spent great efforts for years in studying and improving these defects and come up with the present invention to eliminate the defects mentioned above.

SUMMARY OF THE INVENTION

Accordingly, the main object of the present invention is to provide a heat generating device formed of a plurality of heat generating diaphragm plates whose number of units is relevantly adjustable according to actually required heat generating capacity.

To achieve the above object, the aforesaid heat generating diaphragm plates are formed on an electric conductive supporting frame, wherein the temperature and the heat generating capacity of the heat generating device can be adjusted to meet the actual needs reliably without yielding visible and dangerous burning flames.

Another object of the present invention is to provide a heat generating device which is economically and efficiently operable as a heating device with regard to the ambient temperature, humidity, and the object to be heated.

To achieve the above object, the number of installed heat generating diaphragm plates is made relevantly adjustable.

BRIEF DESCRIPTION OF THE DRAWINGS

The present invention may best be understood through the following description with reference to the accompanying drawings, in which.

DETAILED DESCRIPTION OF THE PREFERRED EMBODIMENTS

Figure 1:
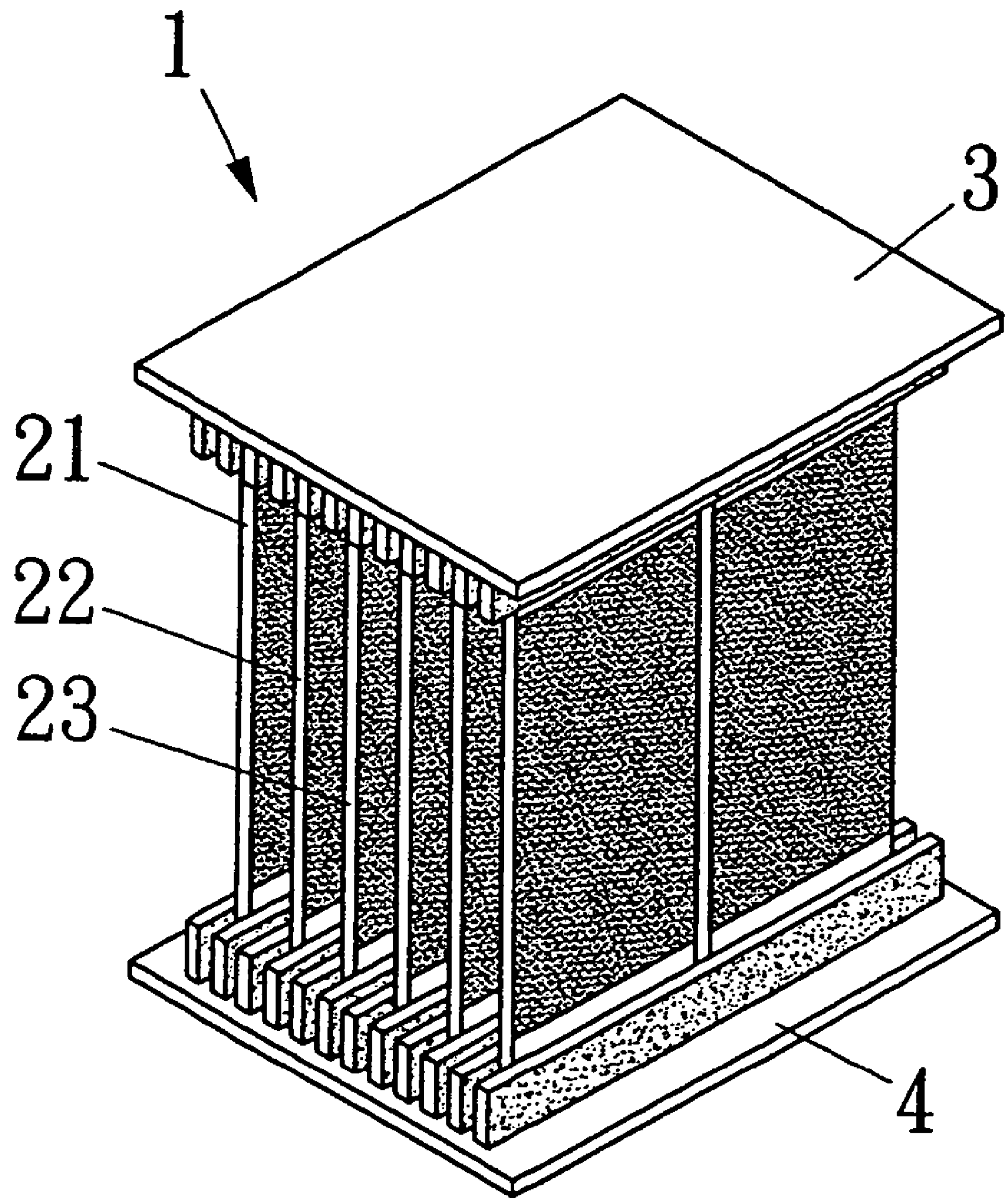
FIG. 1 is a three dimensional assembled view of the present invention.
Figure 2:
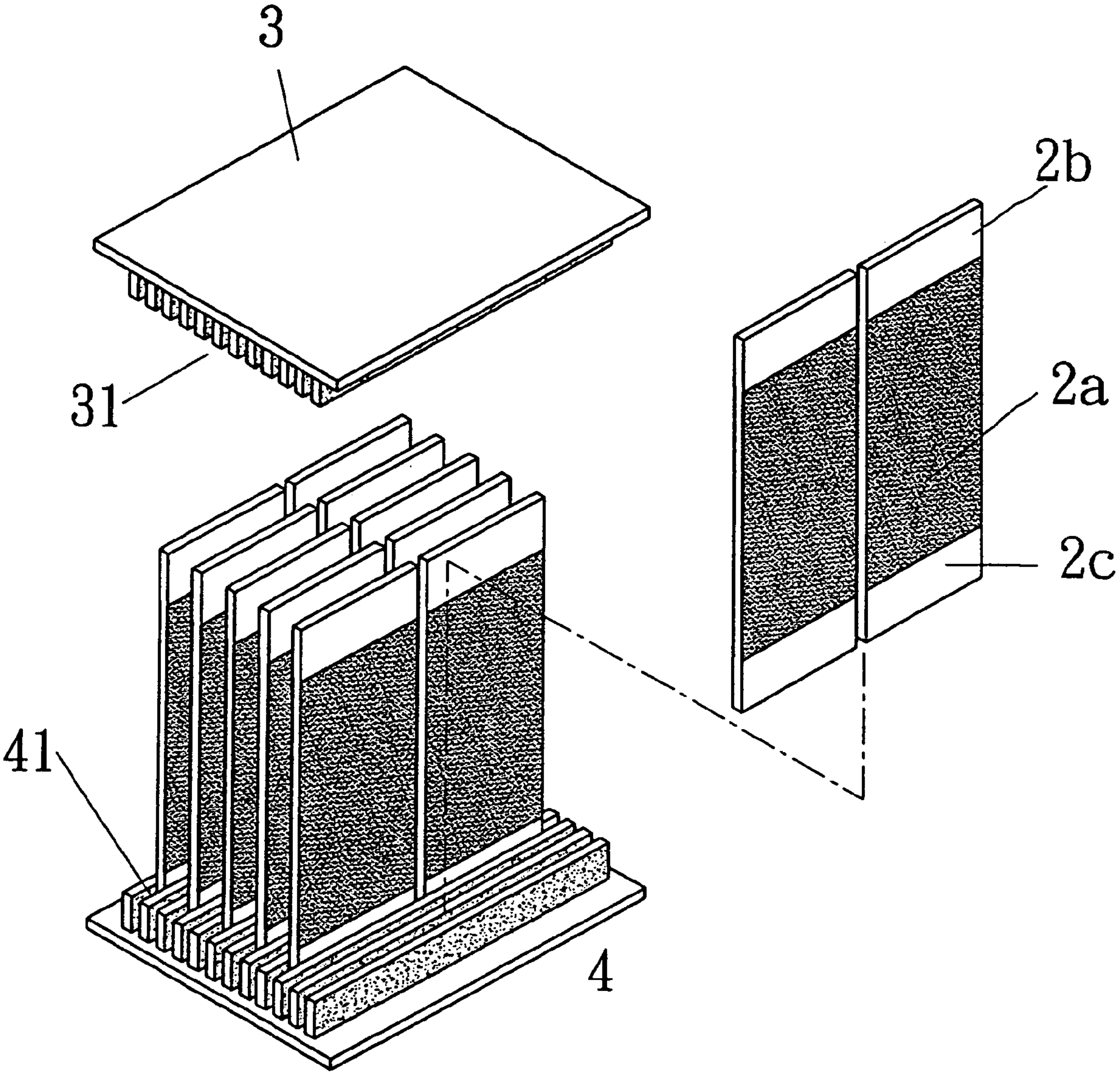
FIG. 2 is the three dimensional exploded view of the present invention.
Figure 3:
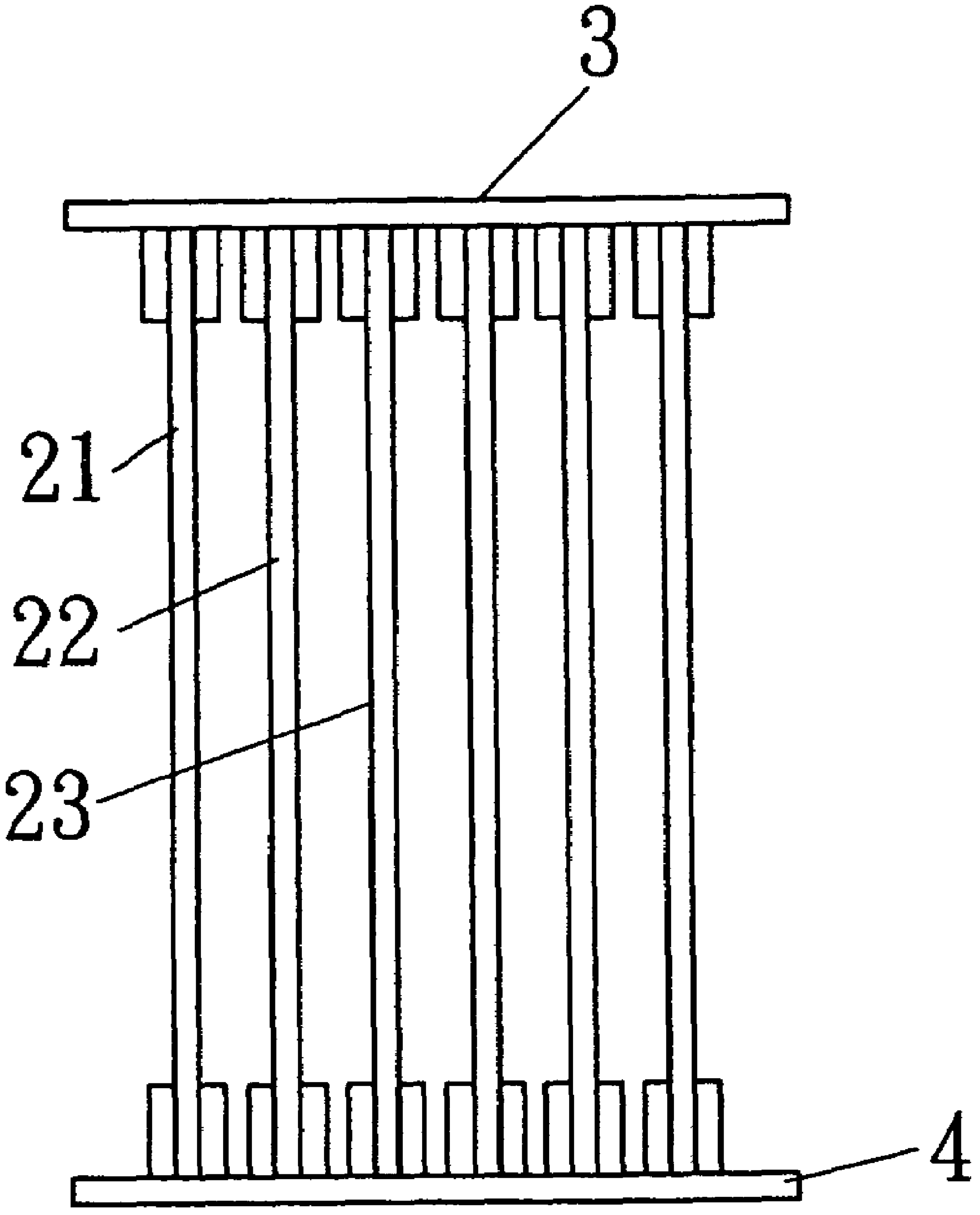
FIG. 3 is the side view of the present invention.

Referring to FIG. 1 through FIG. 3, the heat generating device of the present invention is composed of an electrically conducting supporting frame 1 and a plurality of heat generating diaphragm plates 21, 22, 23 . . . . The supporting frame 1, consisting of two coupled supporting plates 3 and 4 facing against each other with a predetermined spacing and formed in one piece, is made of an electrically conducting material. The surfaces of the two supporting plates 3 and 4 opposite to each other are respectively provided with several insertion slots 31 and 41 whose wall surfaces are coated to form electrode terminals. The central portions of the heat generating diaphragm plates 21, 22, 23 . . . are coated with a heat generating diaphragm 2*a*, and the two terminals thereof are coated with silver solders 2*b* and 2*c* respectively such that an electrical connection is formed among the silver solders 2*b*, 2*c* at the two terminals of the heat generating diaphragm plates 21, 22, 23 . . . , the electrodes formed on the wall surfaces of the insertion slots 31 and 41, and the supporting frame 1 when the heat generating diaphragm plates 21, 22, 23 . . . are inserted into the insertion slots 31, 41.

With the heat generating device constructed as such, its heat generating capacity can easily be adjusted by varying the number of the heat generating diaphragm plates installed in the insertion slots so as to relevantly meet the individual requirements for heated objects and places. In this version, the user is able to enjoy relevant and convenient service from the heat generating device of the present invention which thoroughly eliminates the inconvenience of a conventional heat generating device made of a nichrome wire or a heater coil whose heating capacity is impossible to adjust.

Figure 4:
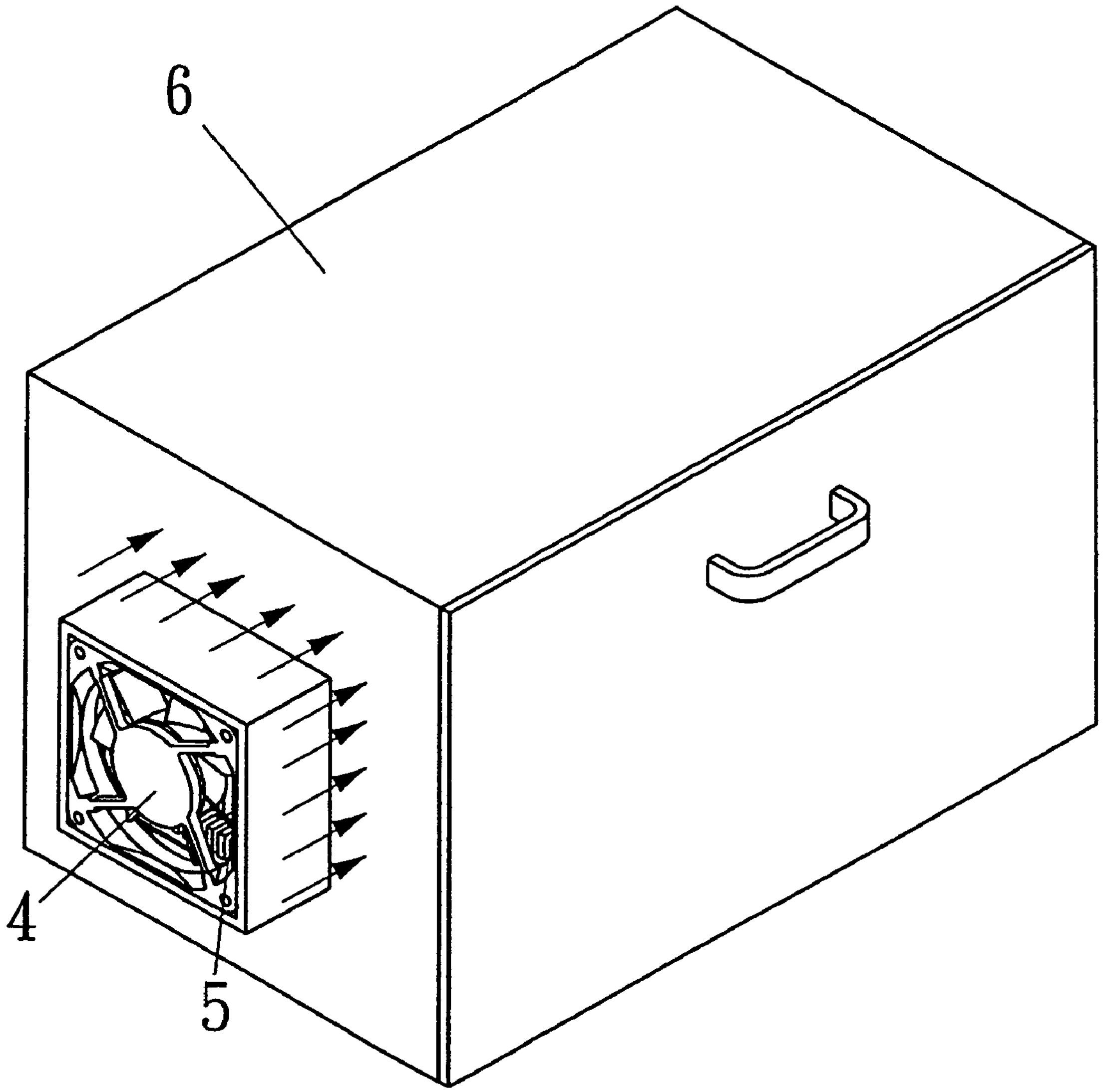
FIG. 4 is an embodiment of the present invention.

Referring to FIG. 4, in this embodiment of the present invention, the heat generating device 5 is associated with a fan 4 to serve as a heat reservoir 6. By adjusting the number of the heat generating diaphragm plates 21, 22, 23 . . . used for the heat generating device 5, the temperature in the heat reservoir 6 can be maintained in a desired value.

Figure 5:
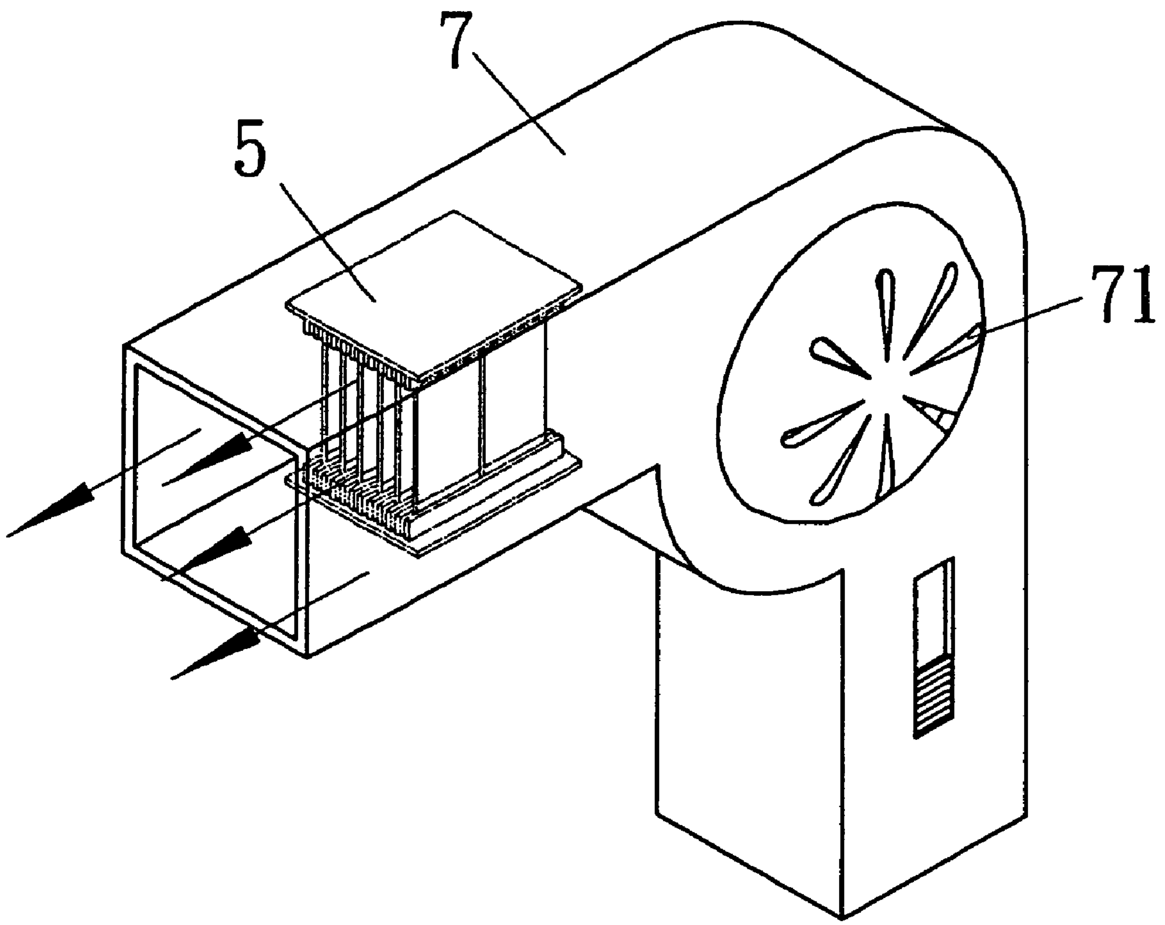
FIG. 5 is another embodiment of the present invention.

FIG. 5 shows another embodiment of the present invention in which the heat generating device 5 is equipped in a hair dryer 7 at the position proximate to the wind exit of the hair dryer 7 so as to output desired hot wind by driving a fan 71.

In all, the heat generating device provided by the present invention is able to set the temperature and generation of heat at a desired value by adjusting the number of the heat generating diaphragm plates inserted in the insertion slots of the heat generating device. As the heat generating diaphragm plate generates heat stably and securely without producing dangerous visible flames thereby providing the user a reliable and convenient heating means. The present invention is a high level technical creation which has neither been published nor put to public use therefore it is entitled for application for patent.

While the invention has been described in terms of what are presently considered to be the most practical and preferred embodiments, it is to be understood that the invention need not be limited to the disclosed embodiments. On the contrary, it is intended to cover various modifications and similar arrangement included within the spirit and scope of the appended claims which are to be accorded with the broadest interpretation so as to encompass all such modifications and similar structures.

What is claimed is:

1. A heat generating device formed of heat generating diaphragm plates composed of an electrically conducting supporting frame and a plurality of heat generating diaphragm plates;

wherein said supporting frame consists of two coupled supporting plates facing against each other with a predetermined spacing, surfaces on said two supporting plates opposite to each other are respectively provided with several insertion slots whose wall surfaces are coated to form electrode terminals such that when said heat generating diaphragm plates are inserted into said insertion slots, an electrical connection is formed among silver solders provided at both terminals of each heat generating diaphragm plate and said electrodes formed on said insertion slots thereby completing said heat generating device capable of adjusting heat generation capacity.

2. The heat generating device as in claim 1, wherein said two supporting plates and said insertion slots are formed in one piece with an electrically conducting material.

* * * * *